United States Patent [19]

Abiven et al.

[11] Patent Number: 4,803,416
[45] Date of Patent: Feb. 7, 1989

[54] STORAGE BATTERY CONTROL DEVICE

[76] Inventors: Jacques Abiven, Coat Mael, Vieux Marché 22420 Plouaret; Eric Audrain, C341 Kervoalan, 22700 Perros Guirec, all of France

[21] Appl. No.: 898,392

[22] Filed: Aug. 20, 1986

[30] Foreign Application Priority Data

Aug. 23, 1986 [FR] France .................... 85 12679

[51] Int. Cl.[4] .................... H02J 7/04; G01R 11/66
[52] U.S. Cl. .................... 320/44; 320/14; 320/48
[58] Field of Search .................... 320/43, 44, 48, 13, 320/14

[56] References Cited

U.S. PATENT DOCUMENTS

| | | | |
|---|---|---|---|
| 3,895,284 | 7/1975 | Schweizer et al. | 320/44 X |
| 3,906,329 | 9/1975 | Bader | 320/44 |
| 3,979,657 | 9/1976 | Yorksie | 320/13 |
| 4,012,681 | 3/1977 | Finger et al. | 320/44 X |
| 4,194,146 | 3/1980 | Patry et al. | 320/48 X |
| 4,388,618 | 6/1983 | Finger | 320/48 X |
| 4,638,237 | 1/1987 | Fernandez | 320/48 |
| 4,679,000 | 7/1987 | Clark | 320/44 X |

Primary Examiner—R. J. Hickey
Attorney, Agent, or Firm—Laubscher, Presta & Laubscher

[57] ABSTRACT

A control device for a storage battery consists of a charge regulating loop including a circuit for supplying clock pulses having a variable frequency proportional to a battery charge and discharge current, a circuit for estimating an instantaneous capacity of the battery depending on a clock pulse up-down count, and a regulating circuit for recharging the battery from a mains or supply voltage as soon as the instantaneous capacity is equal to a first capacity substantially less than a maximum capacity of the battery. According to the invention, the frequency of the clock pulses depends also on at least one of the parameters relating to an energy efficiency of the battery and to a self-discharge current of the battery, so that these parameters are involved in estimating the instantaneous capacity. Also, the device gives warning, through an alarm, that the battery voltage is considerably more than a discharge threshold which, when reached, disconnects the battery from a load circuit. The end of battery life determined depending on charge and discharge cycles and battery ageing is also signaled. The voltage across a resistor connected in series with the battery is amplified by an amplifier having two input terminals connected with the resistor terminals, respectively, via first resistors and first contacts which are closed in response to a detected charging rate, and through second resistors and second contacts which are closed in response to a detected discharging rate.

7 Claims, 3 Drawing Sheets

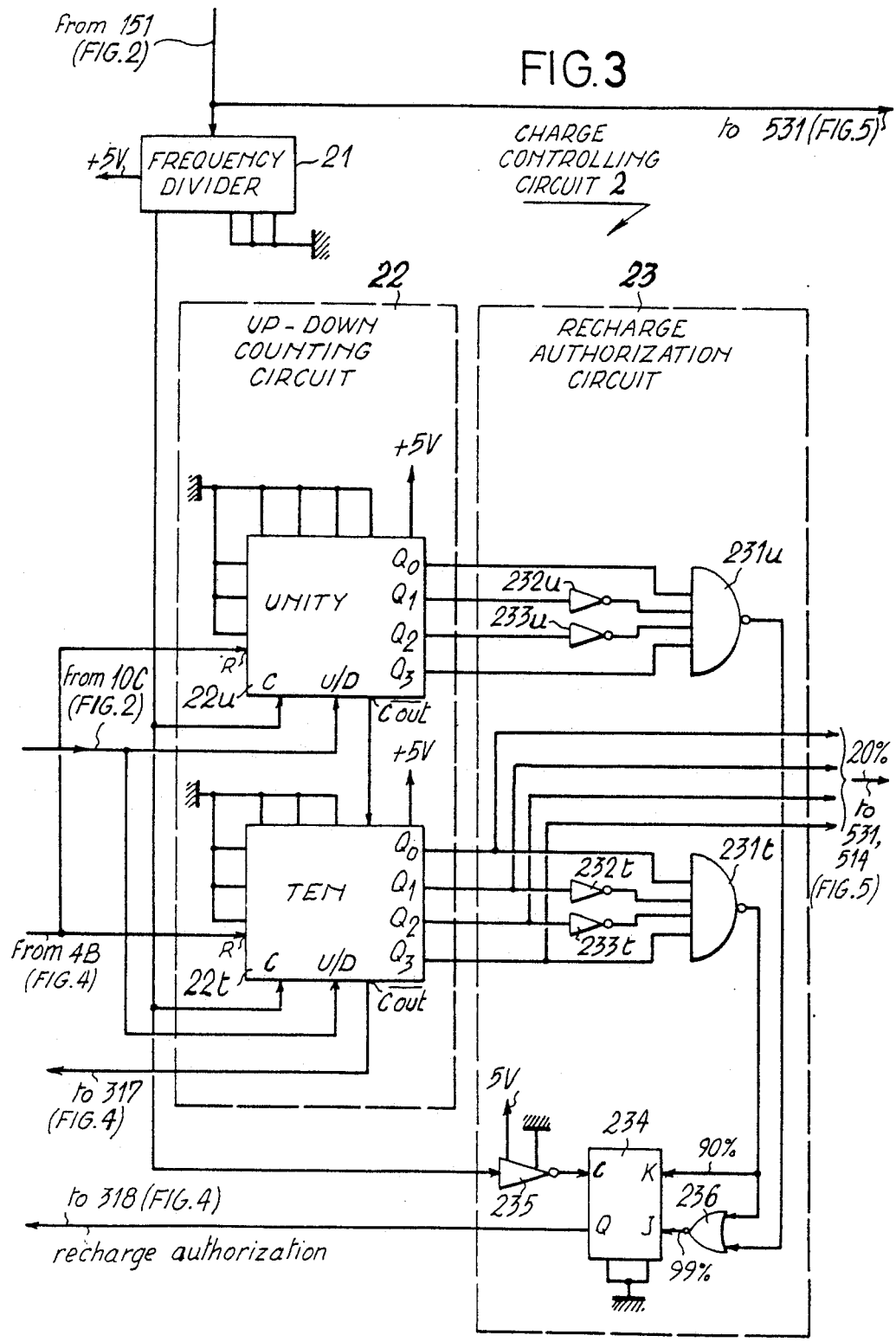

STORAGE BATTERY CONTROL DEVICE

BACKGROUND OF THE INVENTION

1. Field of the Invention

The present invention relates, generally speaking, to a device designed to monitor parameters characterizing the condition of a battery in view of recharging the battery periodically with a high current and signaling any failure on it.

More especially the invention deals with a storage battery control device comprising means for supplying clock signal pulse having variable frequency in proportion to a battery charge and discharge current, means for estimating an instantaneous capacity of the battery depending on a clock signal pulse up-down count, and means for recharging the battery from a mains or supply voltage as soon as the instantaneous capacity is equal to a first capacity substantially less than a maximum capacity of the battery.

2. Description of the Prior Art

In such a known device, the instantaneous capacity of the battery is estimated directly in proportion to the charge and discharge current. However, the available capacity of the battery is always lower than the capacity of the battery on charge. The ratio of the capacity available to the charged capacity, referred to as efficiency, varies depending on the temperature especially when the battery is on full load, and decreases rapidly when the ambient temperature increases. In particular, the self-discharge current increases all the more when the ambient temperature is high. Thus an estimate of the instantaneous capacity without considering the efficiency and the temperature, underestimates and considerably falsifies the capacity measurement on which the cyclic recharge of the battery depends. Without subjecting the battery to an excessive overload that might damage it, it is also of advantage of recharge the battery to a maximum capacity corresponding to a suitable overload rate.

OBJECT OF THE INVENTION

The main object of the present invention is to provide a battery control device in which the capacity of the battery is estimated depending on the energy efficiency and/or the self-discharge.

SUMMARY OF THE INVENTION

Accordingly, a monitoring device as above defined is characterized in that the frequency of the clock signal also depends on at least one of parameters relating to an energy efficiency of the battery and to a self-discharge current of the battery during charging and discharging of the battery.

According to a first embodiment in which the estimated capacity depends on the efficiency, the clock signal supplying means comprises means for detecting one of charge and discharge rates of the battery, means controlled by the detecting means, for amplifying a voltage on terminals of a resistor in series with the battery, depending on a charge efficiency when a charging rate of the battery is detected, and depending on a discharge efficiency when a discharging rate of the battery is detected, and means for frequency converting said amplified voltage into said clock signal. Preferably, the amplifying means comprises an amplifier having two input terminals connected to the terminals of the series-resistor through first resistors and first contacts which are closed in response to a detected charging rate, and through second resistors and second contacts which are closed in response to a detected discharging rate.

According to a second embodiment in which the estimated capacity depends at least on the self-discharge current, the above amplifying means are replaced by or connected in series with means controlled by the detecting means for subtracting or adding a voltage in proportion to the self-discharge current from/or to a voltage on the terminals of the series-resistor or an output voltage from the amplifying means, according to whether a charging or discharging rate of the battery is being detected. In particular, the subtracting or adding means is in the form of a summer with a second input fed with a voltage supplied by a negative temperature coefficient thermistor and operates as a subtractor when the battery is being charged and as an adder when the battery is being discharged.

Thus, according to the first and second embodiments, the energy efficiency of the battery and the self-discharge current are taken into consideration when estimating the capacity.

According to another embodiment of the invention, the estimating means periodically recharges the battery and notably thereby compensating for the self-discharge current varying with the temperature. The estimating means can comprise means having a maximum count corresponding to the maximum capacity of the battery for up-down counting the pulses of the clock signal, means for detecting said maximum count, means for detecting a first count in the up-down counting means corresponding to the first capacity, and means for authorizing the recharging means to recharge the battery as soon as the count of the up-down counting means is less than the first count, then as long as said count is not equal to the maximum count.

According to the invention, charging the battery is regulated depending not only on the amplitude of the charge and discharge current but also on the temperature so as to obtain a suitable but noncontinuous overcharge. There is thus provided means for controlling the charge current injected via a charge regulator, comprising a charge current limiter including, on input, a thermistor connected in parallel with a first contact, the first contact being closed when the battery is in discharging rate and has a capacity lower than the maximum capacity, and being open when the battery in charging rate, and an amplifier having an input connected to an output of the current limiter and to the ground through a second contact controlled by the estimating means, a negative-feedback input to which a voltage is applied from the supplying means in proportion to a charge and discharge current, and an output connected to a charge regulator control input, the second contact being opened as soon as the capacity of the battery is less than said first capacity, then as long as the capacity of the battery is not equal to the maximum capacity.

The control device also monitors other parameters of the battery, as will be seen subsequently, in order to give warning of a discharge of the battery when the voltage on the terminals of the battery is less than a predetermined reference voltage and when the residual capacity of the battery practically discharged is very low. For example, the battery is considered to be "OK" by the control device when the voltage on the terminals of the battery is in the region of 60% of the voltage st full charge and when the capacity of the battery is in the region of 20% of the initial maximum capacity. The control device also gives warning of the estimated end of the battery's service life depending on a predetermined number of battery charge and discharge cycles, on the sum of the depth of these cycles and on the aging of the battery contingent on the temperature.

BRIEF DESCRIPTION OF THE DRAWING

Other features and advantages of this invention will be more clearly apparent from the following more particular description of preferred embodiments of this invention in reference to the corresponding accompanying drawings in which:

FIG. 3 is a detailed block diagram of a charge controlling circuit included in the device;

FIG. 4 is a detailed block diagram of a charge regulating circuit and a discharge break circuit included in the device; and FIG. 5 is a detailed block diagram of a battery life span signaling circuit included in the device.

DESCRIPTION OF THE PREFERRED EMBODIMENTS

Figure 1:
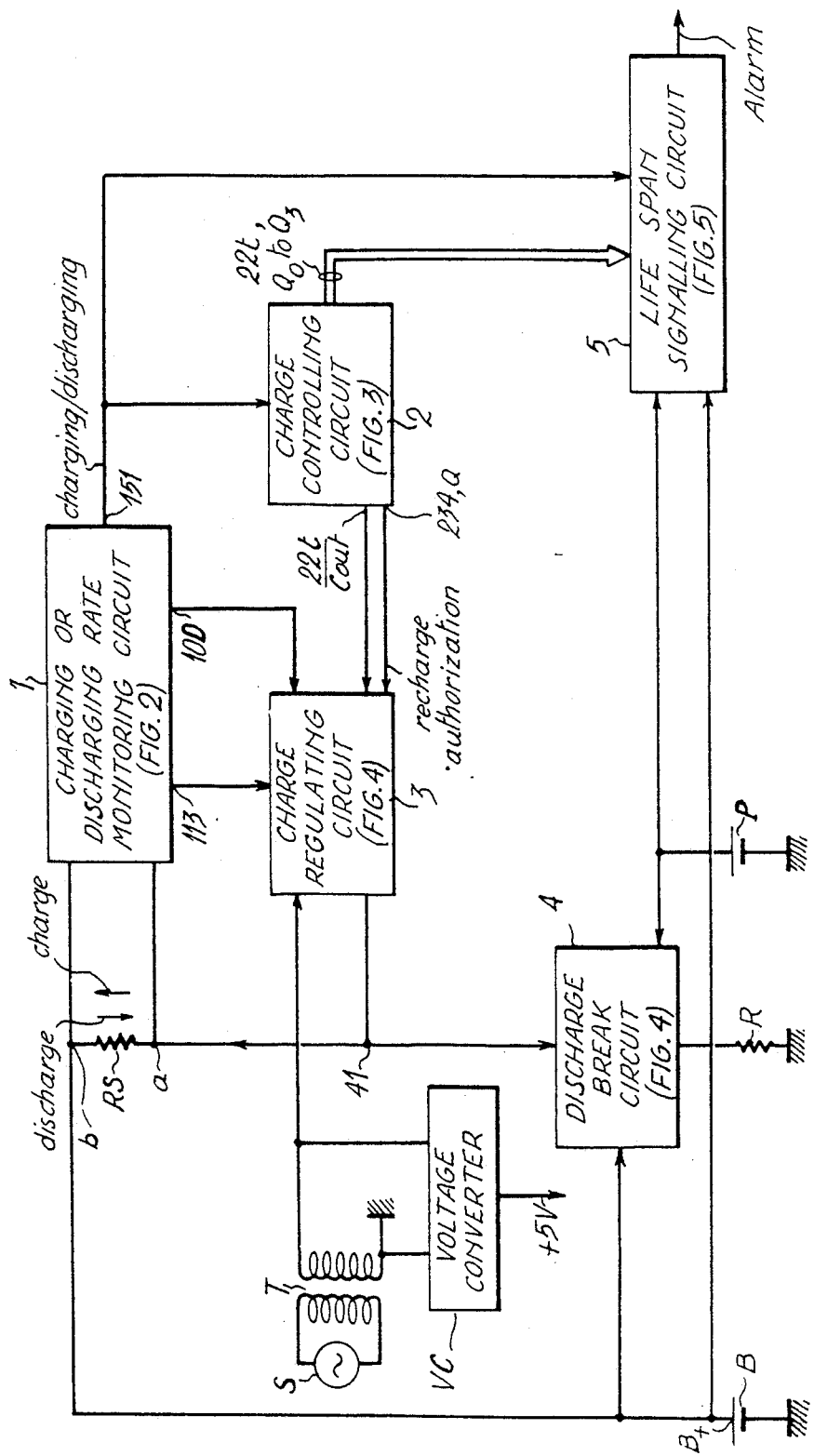
FIG. 1 is a schematic block diagram of a battery control device embodying the invention.

As shown in FIG. 1, a control device monitoring a storage battery B mainly comprises a regulation loop of circuits 1, 2 and 3 designed to recharge the battery through automatic regulation, a discharge break circuit 4 for disconnecting the battery B from a load circuit that is illustrated by a load resistor R, and a life span signaling circuit 5. Most of the circuits included in the control device are supplied by a voltage converter VC supplying a d.c. voltage of 5 V from the a.c. mains S. An independent supply source, such as a 3 volt "memoguard" type battery cell P provide an autonomy for the control device of around 18 years, supplies electronic components in circuit 5 and also acts as a reference voltage source, as will be seen subsequently.

Typical numerical values are indicated in the remainder of the description, for a battery supporting high current charge conditions, consisting of five sealed cadmium-nickel cells, and having a rated voltage on break of 6 V and a voltage on charge of 6.6 V.

The regulation loop comprises a battery charging or discharging rate monitoring circuit 1, a charge controlling circuit 2 and a charge regulating circuit 3. Monitoring circuit 1 detects a battery charge rate and discharge rate analyzing a current flowing through a shunt resistor RS having a low resistance, typically of 1 ohm, very low in comparison to that of the load resistor R. In charge condition, a charge current is taken at a voltage of 10 V on terminals of a secondary winding of a transformer T connected to the 220 V mains S and is rectified and regulated in regulating circuit 3 in order to be applied to battery B through shunt resistor RS. In discharge condition, after a mains break, a discharge current is produced from the battery B and flows through the shunt resistor RS along an opposite direction to that of the charge current. The discharge current is supplied to the load resistor R through the break circuit 4 in conducting condition.

Figure 2:
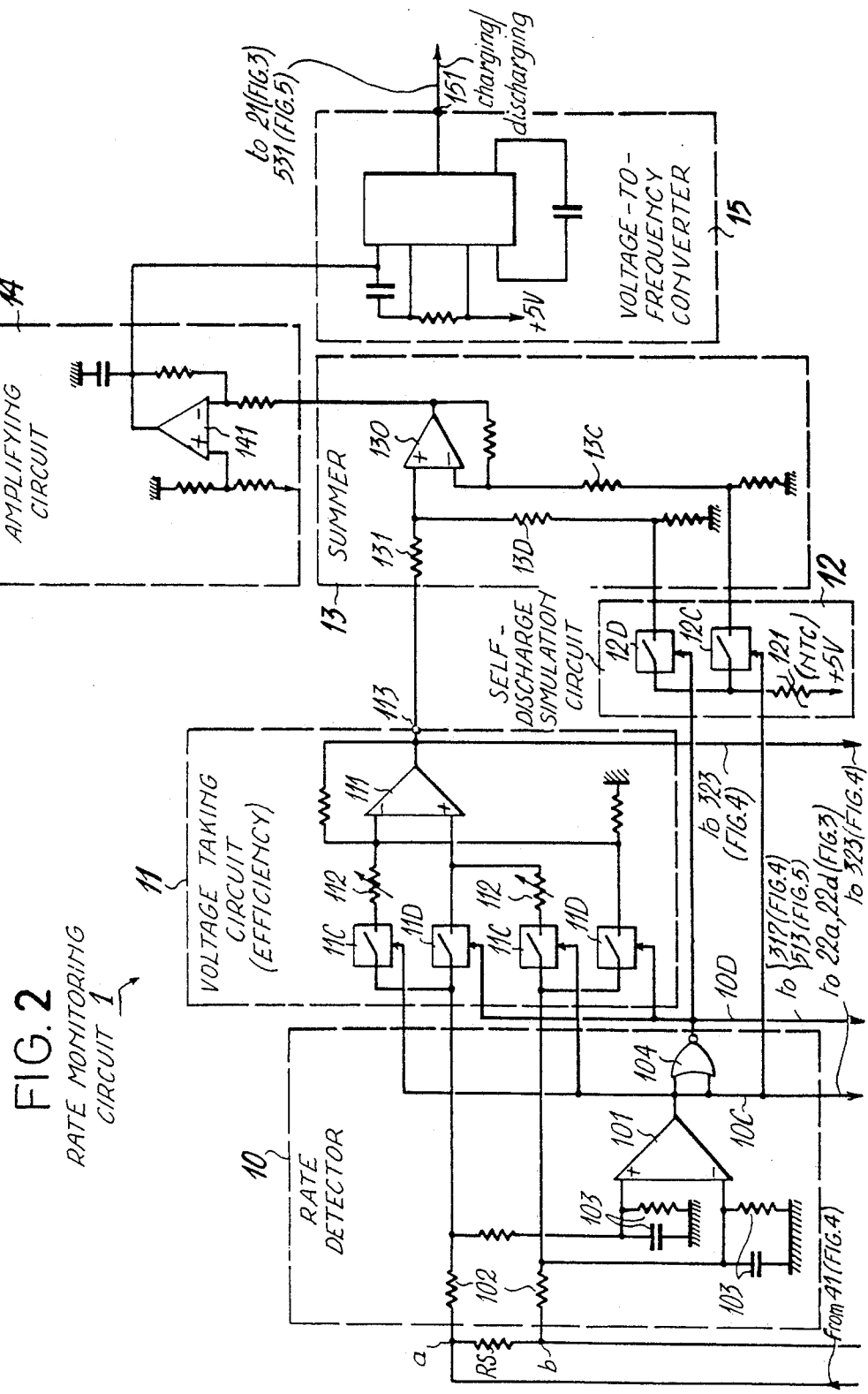
FIG. 2 is a detailed block diagram of a battery monitoring circuit included in the device.

Referring to FIG. 2, the rate monitoring circuit 1 comprises a battery rate detector 10, a voltage taking circuit 11, a self-discharge simulation circuit 12, a summer 13, an amplifying circuit 14 and a voltage-to-frequency converter 15.

Detector 10 detects the direction of the current in shunt resistor RS. When a current flows in the direction from the regulating circuit 2 towards battery B through resistor RS, a first output 10C of detector 10 is in high logic state "1" to indicate a charging rate or condition of battery B. On the contrary, when a current flows in the direction from battery B towards the load resistor R through resistor RS, a second output 10D of detector 10 is in state "1" to indicate a discharging rate or condition of battery B. The detector 10 comprises a voltage comparator including an operational amplifier 101 having two input terminals connected respectively to terminals a and b of resistor RS through resistors 102 and two substantially different input circuits each including a parallel combination 103 of resistor and capacitor. An output terminal of amplifier 101 is the output 10C connected to output 10D through an inverter 104.

The voltage taking circuit 11 comprises an input side, a switching circuit having two pairs of single parallel contacts 11C and 11D and on output side, an operational amplifier 111. The switching circuit takes the voltage on the terminals of the shunt resistor RS through which a charge or discharge current flows, and reverses this voltage, in discharging rate, so that amplifier 111 amplifies the voltage taken whatever the polarity thereof. In circuit 11, the first and second contacts 11C are closed when the charge indication output 10C is in state "1" so as to connect respectively the first and second terminals a and b of resistor RS through resistors 102, to inverse −and direct +inputs of amplifier 111, through two identical resistors 112. In discharging rate, when output 10D is in state "1", the first and second contacts 11D are closed so as to connect the first and second terminals a and b of resistor RS through the resistors 102 directly to the direct +and inverse −terminals of amplifier 111. Amplifier 111 offers a gain in reverse proportion to the sum of the resistances of resistors 102, in parallel with the combination 103 resistors and resistors 112, when charging rate, and in reverse proportion to the resistance of resistors 102, in parallel with combination 103 resistors when discharging rate. Resistors 102, in parallel with combination 103 resistors, and resistors 112 are thus selected to compensate for the drop in efficiency of battery B, especially around the maximum charge. Typically, resistors 102, in parallel with combination 103 resistors, and resistors 112 have resistances equal to 100 and 10 kOhms respectively, corresponding to an energy efficiency or maximum available capacity to charged capacity ratio of 100/120 resistors 112 can be each replaced by a nonlinear component such as a varistor, so as to adjust the charge efficiency levels.

A voltage proportional to a charge current corrected by the drop of efficiency in the battery, or to a discharge current is thus delivered by an output terminal 113 of amplifier 111 and is applied to a direct +input of an operational amplifier 130 through an input resistor 131 in summer 13. Amplifier 130 operates either as a subtractor when the battery is being charged, or as an adder when the battery is being discharged, so as to take into account a permanent self-discharge of the battery B.

In the simulation circuit 12 is provided a thermistor 121 consisting of a negative temperature coefficient (NTC) resistor having a terminal brought up to 5 V. Another terminal of thermistor 121 is connected firstly, to a reverse—terminal of amplifier 130 through a contact 12C and a second input resistor 13C in summer 13, and secondly, to the direct +terminal of amplifier 130 through a contact 12D and a third input resistor 13D in summer 13. The resistance/temperature variation characteristic of thermistor 121 is selected in such a way that it so close to an exponential self-discharge current/temperature characteristic of battery B so that, in the value of the charge or discharge current estimated by the monitoring circuit 1, the self-discharge current of the battery is taken into account. As will be seen subsequently, the charge or discharge current corrected by the loss of charge efficiency and the self-discharge current, enables the "theoretical" capacity of the battery to be estimated at all moments in the charge controlling circuit 2.

Contact 12C, like contacts 11C, is closed in charge state under the control of output 10C of rate detector 10, which starts summer 13 operating as a subtractor; the summer subtracts a "self-discharge" voltage set by thermistor 121 from the "charge" voltage delivered by amplifier 111 in order to obtain a "theoretical charge" voltage delivered by an output of amplifier 130. In discharging condition, the contact 12D, like contacts 11D, is closed under the control of output 10D of rate detector 10; summer 13 then operates as an adder to add the "discharge" voltage delivered by amplifier 111 and the "self-dicharge" voltage into a "theoretical discharge" voltage delivered by the output of amplifier 130.

Then the theoretical charge or discharge is amplified in amplifying circuit 14 including a non-inversing operational amplifier 141 and is converted linearly into frequency in the voltage-to-frequency converter 15. Converter 15 operates linearly on three frequency decades and supplies to output 151 a clock signal having typically a frequency lying between 1.2 Hz and 1.2 kHz. The frequency of the clock signal is all the higher when the theoretical charge current is high so as to rapidly recharge the battery and avoid any untimely overload of the battery, or when the theoretical discharge current is high so as to rapidly halt any discharge of the battery as soon as the instantaneous capacity of the battery reaches a theoretical discharge rated capacity. In case of the battery being not used, the clock signal has a relatively low frequency proportional to the simulated self-discharge current.

As shown in FIG. 3, the charge controlling circuit 2 comprises a frequency divider 21, an up-down counting circuit 22 with maximum count of 99, and a recharge authorization logic circuit 23. The frequency divider 21 divides the variable frequency of the clock signal delivered by output 151 of the voltage-to-frequency converter 15 typically by $2^{19}$. Divider 21 applies a second clock signal having frequencies lying between $2.3 \times 10^{-6}$ and $2.3 \times 10^{-3}$ Hz to clock inputs C of two cascade-wise decimal up-down counters 22u and 22t in circuit 22. Up-down counters 22u 22t produce, through four respective outputs $Q_0$, $Q_1$, $Q_2$ and $Q_3$, a and unities figure and a tens figure encoded in binary, forming a clock pulse count of the second clock signal representing the instantaneous "theoretical" capacity of battery B. In charging condition, output 10C of rate detector 10 sets to state "1" up-down counting inputs U/D of up-down counters 22u and 22t so that they count pulses of the second clock signal until the maximum capacity of the battery is reached and corresponds to a count equal to 99. In discharge condition, or else simply in self-discharge condition, output 10C of rate detector 10 is still to state "0" and controls a down counting of the pulses of the second clock signal. This down counting can be halted as soon as the capacity of the battery has diminished to a given percentage equal to 90% of the maximum capacity, after triggering a battery recharge through logic circuit 23.

Logic circuit 23 comprises two NAND gates 231u and 231t. Two inputs of gates 213a and 231t are connected directly to outputs $Q_0$ and $Q_3$ of up-down counters 22u and 22d respectively, and two other inputs of gates 213a and 231t are connected to outputs $Q_1$ and $Q_2$ of up-down counters 22a and 22d respectively through inverters 232u, 233u, and 232t, 233t, so as to detect the unities and tens figures of the pulse count equal to 9. Circuit 23 also includes a bistable flip-flop JK 234 having a clock input C connected to the output of frequency divider 21 through an inverter 235, a clock input J connected to outputs of gates 231u and 231t through a two-input NOR gate 236, and an input K connected directly to the output of gate 231t.

As soon as the instantaneous capacity of battery B reaches the rate of 99% indicated by circuit 22, inputs J and K are respectively to states "1" and "0", and responsive to a clock pulse in input C of the flip-flop, an output Q of flip-flop 234 switches to state "1" thereby deactivating the charge regulating circuit 3 and thus avoiding an over-load of battery B. This deactivation is obtained by closing a contact 318 placing an input of regulating circuit 3 to the ground potential as will be seen subsequently. After a discharge or self-discharge of the battery and hence a down counting in circuit 22, the instantaneous capacity of the battery reduces from 99% to 90%, input J switches to state "0" and latches output Q to state "1", whatever the pulse applied to flip-flop input C. As soon as the instantaneous capacity of the battery reaches a value less than 90 %, output K switches to state "1", input J remains in state "0" and output Q switches to state "0" in response to a pulse on flip-flop input C, which opens the aforesaid contact 318 and authorizes regulating circuit 3 to recharge battery B. The regulating control expressed by state "0" on output Q of flip-flop 234 is held as long as the instantaneous capacity is lower than 90%, and is even latched in this state when the battery is recharged for a capacity of 90 to 99% corresponding to states "0" of inputs J and K. Switching from state "1" to state "1" of input J resets output Q to state "1" and deactivates regulating circuit 3 so as not to charge the battery as long as the instantaneous capacity of the battery has not dropped as far as 89%.

Referring to FIG. 4, the charge regulating circuit 3 comprises a charge current limiter 31, a charge automatic control circuit 32 and a charge regulator 33.

The charge current limiter 31 includes a non-inverting operational amplifier 311 connected to an input circuit supplying a voltage depending on the temperature via a negative temperature coefficient thermistor 312. Thermistor 312 is interconnected between a resistor 313 brought up to 5 volts and a resistor 314 connected to the ground. A terminal common to resistor 314 and thermistor 312 is connected to a direct +input terminal of amplifier 311 via a resistor 315. A contact 316 is connected in parallel with thermistor 312 and is controlled by a OR logic circuit 317 having a first input connected to output 10D of rate detector 10 and a second input connected to a cascade setting output of up-down counter 22t. The output of each up-down counter 22u, 22t is to state "0" when the unities or tens figure is equal to 9.

The contact 318 that is, as already stated, controlled by output Q of flip-flop 234, is interconnected between the ground and an output t terminal of amplifier 311 connected to a direct +input of an operational amplifier 321 included in the control circuit 32. In circuit 32, a reverse−input of amplifier 321 is connected to a terminal of a negative-feedback resistor 322 and to output 113 of amplifier 111 in the voltage taking circuit 11 via a resistor 323.

The charge regulator 33 is a current regulator including a field effect transistor 331 and a npn transistor 332. Transistors 331 and 332 have a drain and a collector connected to transformer T via a rectifier diode 333 and to a terminal of load resistor R, respectively. A source of transistor 331 and a base of transistor 332 are connected together. A gate of transistor 331 is connected to an output terminal of amplifier 321 via a gate resistor 334. An emitter of transistor 332 is connected to an input terminal 41 of the discharge break circuit 4 and to positive terminal $B_+$ of battery B via shunt resistor RS.

As already stated, the control contact 318 is opened as soon as the capacity of the battery is below 90% of its maximum capacity.

If the battery ceases to be in discharging condition, switching to charging condition indicated by state "0" on output 10D opens contact 316, output of up-down counter 22t being to state "0", i.e., the charged capacity being greater than or equal to 90 %. Thermistor 312 then acts to impose a reference voltage which depends on the temperature on the direct input of the control amplifier 321 and which is amplified by the charge level imposed by output 113 of amplifier 111. The current limiter 31 thus limits any overload current depending on the temperature.

The discharge break circuit 4 is also shown in FIG. 4. It includes a switch in the form of a Darlington circuit having two pnp transistors 42 and 43, interconnected between terminal 41 and the load resistor R to break off the discharge of the battery when its voltage drops below a so-called halt voltage. Circuit 4 also comprises a voltage comparator including an operational amplifier 44. Amplifier 44 compares a reference voltage equal to the voltage of battery cell P and applied to a direct +input terminal of amplifier 44, with a voltage applied to a reverse−input terminal of amplifier 44 and established by a voltage divider 45 connected to battery terminal $B_+$. The value of the halt voltage is for example fixed at 75% approximately of the rated voltage on the terminals of the battery. The output of amplifier 44 is connected to a base of the Darlington circuit via a resistor 46 and thus turns off transistors 42-43 in order to disconnect battery B from the load resistor R when the voltage on the input of amplifier 44 becomes lower than the voltage of the battery cell (3 volts), i.e., when the voltage on the terminals of the battery drops below 4.5 V. For this purpose, a voltage fraction taken by the voltage divider 45 is $2/3 = 66\% = 3/(6 \times 0.75)$. Thus any polarity reversal of the cells of battery B owing to too much discharge is avoided.

Before dropping through the halt voltage, the invention schedules warning a user that the mains are broken, i.e., that the battery B is in discharge rate and that the load resistor R risks being no longer supplied. The life span signaling circuit 5 shown in FIG. 5 indicates, amongst other things, a forthcoming discharge of the battery, through an alarm signal. For this purpose, circuit 5 comprises a discharge end detecting circuit 51 including an operational amplifier 511 having a direct +input connected to battery cell P and a reverse−input connected to battery terminal $B_+$ via a voltage divider 512. Amplifier 511 is activated as described hereinafter, when the voltage delivered by battery B drops below a predetermined threshold, referred to as "alarm voltage", higher than the halt voltage and substantially equal to 83% of the rated battery voltage. Dropping through this predetermined threshold is conventionally considered as being an indication of full discharge of the battery and can be used as an alarm signal. In practice, in the example of embodiment described, amplifier 511 delivers a "1" when divider 512 delivers a voltage lower than the voltage of battery cell P, i.e., when the voltage delivered by the battery B becomes lower than the alarm voltage, i.e., 6 volts $\times 0.83 = 3$ volts. For this purpose, the voltage divider 512 has a division ratio equal to 60% $= 3/(6 \times 0.83)$. The output signal from amplifier 512 is delivered to an input of a three-input AND gate 513. Two other inputs of gate 513 are connected to the output 10D of the rate detector and to an output of an OR gate 514 respectively. Gate 514 has three inputs connected to outputs $Q_1$, $Q_2$ and $Q_3$ of up-down counter 22t so as to detect an instantaneous capacity of at least 20% of the theoretical rated capacity of battery B. Thus, when the battery is in discharging rate, the AND gate 513 produces a capacity loss alarm pulse, if the battery voltage reaches the alarm threshold before the information on output from the OR gate 514 signifies a discharge of 80% of the rated capacity of the battery. The alarm pulse is transmitted via a two-input OR gate 52.

Still referring to FIG. 5, the life span signaling circuit 5 includes means 53-54 for estimating the battery charge-discharge cycles and aging of the battery depending on the temperature so as to signalize a forthcoming failure of the battery B.

A charge-discharge cycle estimating circuit 53 is designed to cycles, these two parameters reducing the effective life span of battery B. Circuit 53 includes a programmable frequency divider 531, a divide-by-$2^{18}$ frequency divider 532 and a D flip-flop 533. Frequency divider 531 receives, through a clock input C, the clock signal t delivered by output 151 of the voltage-to-frequency converter 15 and having a frequency proportional to the intensity of the charge or discharge current, and by an address bus connected to output $Q_0$ to $Q_3$ of the second up-down counter 22t, the battery capacity with an accuracy of 10%. An output 534 of the programmable divider 531 supplies to an input of the frequency divider 532 a discharge depth signal having a frequency in reverse proportion to the battery capacity and reduced in comparison with that of the charge or discharge clock signal, and thus all the greater when the battery capacity is low for a given discharge or charge current. After frequency division in divider 532, the depth signal is applied to a clock input C of flip-flop 533 having an output Q connected to a reset input R so as to put the discharge depth signal in the form of constant width pulses. A counter 55 counts the pulses of the depth signal delivered from output Q of flip-flop 533 via a two-input OR gate 56.

A variable frequency oscillator 541 and a D flip-flop 542 are provided in aging estimating circuit 54 included in circuit 5. In particular the oscillator 541 includes a negative temperature coefficient thermistor 543 in order to supply a clock signal having a frequency varying in relation to the temperature, and a selected rated frequency f=200 Hz in relation to an average life span of battery B previously determined. For example, when the temperature is increasing from 20° C to 40° C, the frequency of oscillator 541 doubles in order to simulate a reduction by half of the battery life span. Aging signal delivered from oscillator 541 is applied to a clock input C of flip-flop 542 having an output Q connected to a reset input R. Aging signal pulses are calibrated by flip-flop 542, then applied to counter 55 through the OR gate 56.

Depending on criteria indicated by the manufacturer of battery B, counter 55 has a maximum count corresponding to the life span of the battery, i.e., both its operating life and number of charge-discharge cycles that it can undergo during this span. Thus, when the number of pulses in the depth signal and aging signal reaches the maximum count, an output of counter 55 signals a "life end" of the battery via OR gate 52. The division ratios in the programmable divider 531 are all the higher when the discharge depths are great. For example, with discharge depths lying between 10% and 20%, 50% and 60%, and 80% and 90%, the depth signal includes 100 to 211, 646 to 846 and 1429 to 1929 pulses for a given discharge current. $7.3 \times 10^{10}$ pulses of the discharge depth signal signalize for example 1800 discharge-charge cycles with a depth of 50%, expressed by a change in state of the output of counter 55.

Moreover, as shown in FIG. 4, outputs of amplifier 44 in break circuit 4 and a resistor-capacitor power supply break detecting circuit 47 are connected, via a OR gate 48, to reset inputs R of up-down counters 22u and 22t (FIG. 3) thereby reinitializing, i.e., resetting the control device when battery B is at the end of discharge or is replaced by a new battery. Counter 55 is also reset in case of changing battery.

What we claim is:

1. A control device for a storage battery, comprising
   (a) means for supplying clock pulses having a variable frequency proportional to a battery charge and discharge current, said clock pulse supplying means being responsive to an estimation of charge energy efficiency and to an estimation of a self-discharge current of the battery, said self-discharge current estimation being a function of temperature;
   (b) means for estimating an instantaneous capacity of the battery depending on a clock pulse up-down count;
   (c) means including a supply voltage for recharging the battery as soon as said instantaneous capacity is less than a first capacity below the maximum capacity of the battery and as long as the instantaneous capacity differs from a second capacity substantially equal to said maximum capacity and more than said first capacity, said recharging means including means controlled by said estimating means for monitoring said charge current depending on the amplitude of said charge and discharge current and on temperature; and
   (d) means for evaluating aging of the battery by counting pulses having a variable frequency depending on ambient temperature, on said charge and discharge current, and on said estimated instantaneous capacity of the battery, thereby producing an alarm signal when said variable frequency pulses reach in number a predetermined value.

2. A control device as defined in claim 1, wherein said clock pulse supplying means comprises means connected with a resistor connected in series with the battery and producing a charge and discharge current measuring voltage representative of said battery charge and discharge current for amplifying said charge and discharge current measuring voltage depending on said charge energy efficiency estimation in response to detected charging and discharging conditions, said amplifying means comprising first and second resistors connected, respectively, with said series-connected-resistor in response to said detected charging and discharging conditions and determining first and second amplification gains of said charge and discharge current measuring voltage, respectively, said first resistors including varistors.

3. A control device as defined in claim 2, wherein said clock pulse supplying means comprises means controlled by said detected charging and discharging conditions for subtracting a self-discharge current estimating voltage from said series-connected-resistor terminal voltage in response to said detected battery charging condition and for adding self-discharge current estimating voltage to said charge and discharge current measuring voltage in response to said detected battery discharging condition, said subtracting and adding means including a thermistor, first and second contacts closed in response to said detected charging and discharging conditions, respectively, and a voltage summer having a first input fed by said charge and discharge current measuring voltage, a subtracting input connected with said thermistor via said first contact, and an addition input connected with said thermistor via said second contact.

4. A control device as defined in claim 1, wherein said aging evaluating means comprises
   (1) a variable frequency oscillator including a thermistor and delivering first pulses having a variable frequency depending on ambient temperature;
   (2) a programmable frequency divider for dividing said estimated capacity and for delivering second pulses having a variable frequency depending on said charge and discharge current and on said estimated capacity; and
   (3) means for counting said first and second variable frequency pulses, thereby producing an alarm signal when said variable frequency pulses reach in number said predetermined value.

5. A control device for a storage battery, comprising
   (a) means for supplying clock pulses having a variable frequency proportional to a battery charge and discharge current, said clock pulse supplying means also being responsive to at least one of two parameters a first one of which is an evaluation of charge energy efficiency and a second one of which is an evaluation of a self-discharge current of the battery;
   (b) means for estimating an instantaneous capacity of said battery depending on a clock pulse up-down count; and
   (c) means including a supply voltage for recharging said battery as soon as said instantaneous capacity is less than a first capacity below the maximum capacity of the battery and as long as the instantaneous capacity differs from a second capacity substantially equal to said maximum capacity and more than said first capacity;

(d) said recharging means including a charge regulator connected with said battery and with said supply voltage means, and means con trolled by said estimating means for monitoring said charge current, via said regulator, depending on amplitude of said charge and discharge current and temperature;

(e) said charge current monitoring means including
  (1) a charge current limiter and an amplifier;
  (2) said limiter including on input a thermistor connected in parallel with a first contact controlled by said supplying means;
  (3) said first contact being closed when the battery is in discharge condition and has a capacity lower than said maximum capacity, and being opened when the battery is in charge condition;
  (4) said amplifier having an input connected to an output of said current limiter and to a second contact controlled by said estimating means, a negative-feedback input to which a voltage proportional to said charge and discharge current is applied by said supplying means, and an output connected to a control input of said charge regulator;
  (5) said contact being opened as soon as said battery capacity is lower than said first capacity, then as long as said battery capacity is not equal to said maximum capacity.

6. A control device as defined in claim 5, and further comprising means for evaluating aging of the battery by counting pulses having a variable frequency depending on ambient temperature, on said charge and discharge current, and on said estimated instantaneous capacity of the battery, thereby producing an alarm signal when said variable frequency pulses reach in number a predetermined value.

7. A control device as defined in claim 6, wherein said aging evaluating means comprises
  (1) a variable frequency oscillator including a thermistor and delivering first pulses having a variable frequency depending on ambient temperature;
  (2) a programmable frequency divider for dividing said frequency of said clock pulses depending on said estimated capacity and for delivering second pulses having a variable frequency depending on said charge and discharge current and on said estimated capacity; and
  (3) means for counting said first and second variable frequency pulses, thereby producing an alarm signal when said variable frequency pulses reach in number said predetermined value.

* * * * *